United States Patent [19]

Potter

[11] Patent Number: 4,922,323
[45] Date of Patent: May 1, 1990

[54] HERMETICALLY SEALED MULTILAYER ELECTRICAL FEEDTHRU

[75] Inventor: Curtis N. Potter, Austin, Tex.

[73] Assignee: Microelectronics and Computer Technology Corporation, Austin, Tex.

[21] Appl. No.: 151,146

[22] Filed: Feb. 1, 1988

Related U.S. Application Data

[62] Division of Ser. No. 36,404, Apr. 9, 1987.

[51] Int. Cl.⁵ .................... H01L 23/48; H01L 29/46; H01L 23/30; H01L 29/62
[52] U.S. Cl. ........................................ 357/71; 357/73; 357/54
[58] Field of Search .............................. 357/71, 73, 54

[56] References Cited

U.S. PATENT DOCUMENTS

| | | | |
|---|---|---|---|
| 4,023,197 | 5/1977 | Magdo et al. | 357/68 |
| 4,163,239 | 7/1979 | Carter | 357/71 |
| 4,197,555 | 4/1980 | Uehara et al. | 357/71 |
| 4,308,090 | 12/1981 | Te Velde et al. | 357/71 |
| 4,472,730 | 9/1984 | Ohta | 357/73 |
| 4,729,063 | 3/1988 | Matsuo et al. | 357/71 |

FOREIGN PATENT DOCUMENTS 0123873  9/1979  Japan .................................... 357/73

OTHER PUBLICATIONS

Mathers "Hybrid Microelectronic Package" IBM Technical Disclosure Bulletin vol. 12, No. 8, Jan. 1970.

Primary Examiner—Eugene R. Laroche
Assistant Examiner—Michael Shingleton
Attorney, Agent, or Firm—Fulbright & Jaworski

[57] ABSTRACT

A method for producing miniature, planar, hermetically sealed, electrical feedthrus having multiple layers of molybdenum conductors separated by aluminum which is anodized and selectively etched for providing supports for the multilayer. The exposed molybdenum is cleaned and oxidized and sealed with glass to provide a hermetic seal. Contact portions of the molybdenum are cleaned and plated whereby the contacts will accept a contact seal.

1 Claim, 2 Drawing Sheets

HERMETICALLY SEALED MULTILAYER ELECTRICAL FEEDTHRU

This is a division, of application Ser. No. 07/036,404 filed 04/09/87.

BACKGROUND OF THE INVENTION

It is known to fabricate multiple layers of metal electrical conductors embedded in a dielectric layer and supported thereby for connecting the conductors to various electrical components such as semiconductors. The present invention is directed to such a multilayer electrical feedthru for use on a substrate in which the conductors are supported and hermetically sealed.

Summary

The present invention is directed to a method of making a hermetically sealed multilayer electrical feedthru connector in which multiple layers of metal conductors are alternately separated by aluminum which is anodized and converted to aluminum oxide, $Al_2O_3$. The metal conductors may be any metals whose native oxides will seal to a glass such as molybdenum, kovar alloy, or dumet alloy. The bulk of the anodized aluminum is selectively removed by a photomasking and etching process to provide anodized aluminum supports where required. The exposed metal is oxidized and a reflow glass solution is applied to the exposed metal then heated to form a hermetic glass-to-metal seal. Contacts on the metal are cleaned and plated so that they will accept a contact seal.

A still further object of the present invention is the provision of a method of making a hermetic sealed multilayer electrical feedthru connector by coating a substrate with a layer of molybdenum, coating the molybdenum with a layer of aluminum and anodizing the aluminum. The method further includes depositing and patterning a second layer of molybdenum over the anodized aluminum and coating a second layer of aluminum over the second layer of pattern molybdenum feedthrus and anodizing the second layer of aluminum. The method then includes the step of applying an etch mask to the top of the second layer of the anodized aluminum over areas where it is desired to provide supports leaving the other areas bare and thereafter etching out the anodized aluminum in the bare areas. Thereafter, the exposed molybdenum is cleaned and oxidized and a glass solution is deposited on the exposed molybdenum then heated to provide a hermetic glass-to-metal seal.

Still a further object of the present invention is the step of cleaning contact portions of the molybdenum and plating the contact portions whereby the contact portions will accept a contact seal.

Still a further object of the present invention is the provision of a hermetically sealed multilayer electrical feethru connector which includes multiple layers of electrical molybdenum conductors, said layers being supported by spaced anodized aluminum dielectric supports, and said molybdenum conductors sealed by a glass forming a hermetic glass-to-metal seal. The conductors also include plated contact portions for connection to other electrical conductors.

Other and further objects, features and advantages will be apparent from the following description of a presently preferred embodiment of the invention, given for the purpose of disclosure and taken in conjunction with the accompanying drawings.

DESCRIPTION OF THE PREFERRED EMBODIMENT

The present invention is directed to a method of manufacturing miniature, planar, hermetic, electrical feedthrus for use as electrical connectors for high density substrates in which the dimensions, number of layers, types of metal and shapes can be varied over a wide range.

Figure 1:
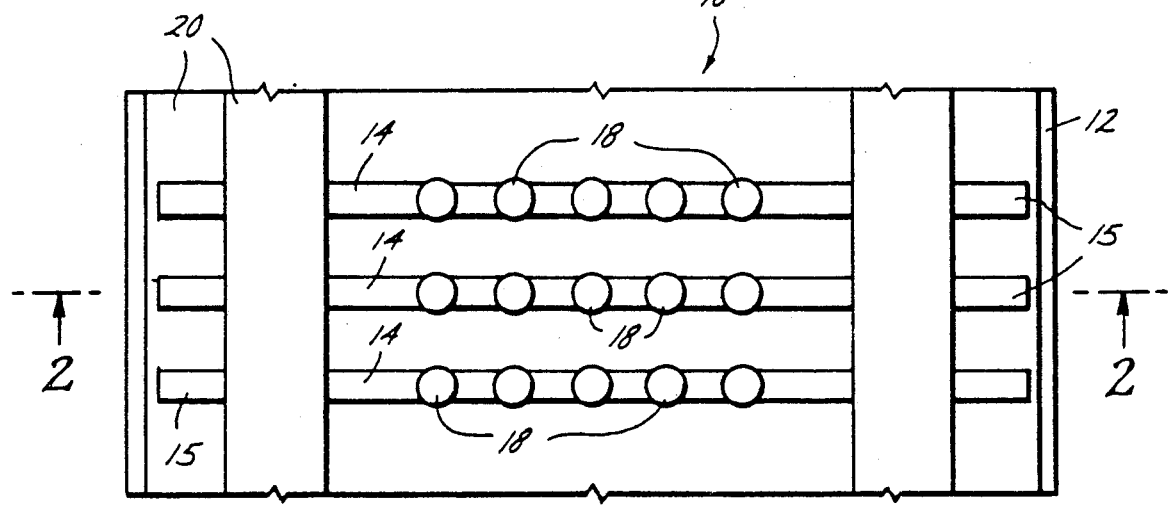
FIG. 1 is a fragmentary elevational view, in schematic, illustrating the position of metal feedthrus, supports and contacts.
Figure 6:
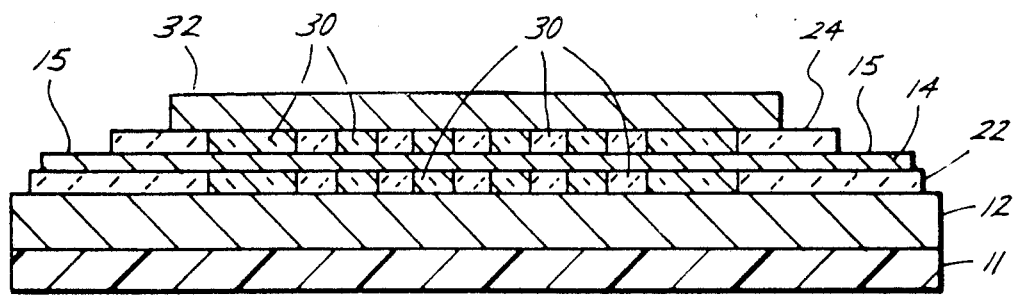
FIG. 6 is a view similar to FIG. 5 showing the finished feedthru.

Referring now to the drawings, and particularly to FIGS. 1 and 6, a feedthru conductor is generally indicated by the reference numeral 10 which is formed on a conventional substrate wafer 11 such as a conventional semiconductor wafer. The connector 10 includes a bottom molybdenum plate 12. For convenience of manufacture, a plurality of molybdenum electrical conductor feedthrus 14 may be provided and fabricated on a single substrate wafter 11 which can then be separated such as by sawing at the completion of fabrication to provide a plurality of feedthru connectors. The connector 10 may include a molybdenum top plate 32 and the molybdenum conductors 12, 14 and 32 are separated by a plurality of supports such as pillars 18 and edge supports 20.

Figure 2:
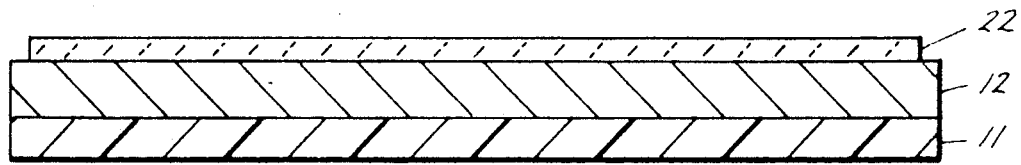
FIG. 2 is a cross-sectional view taken along the line 2—2 of FIG. 1 showing one step in the process of making the multilayer electrical feedthru of the present invention.

Referring now to FIG. 2, a coating of molybdenum 12 is provided on a conventional substrate 11 such as a semiconductor wafer. The molybdenum may be sheet molybdenum or vacuum deposited molybdenum and may be of a thickness of 1 micron to 1,000 microns. A coating of aluminum 22 is deposited on top of the molybdenum 12 such as by vacuum depositing aluminum or providing an aluminum alloy film to the necessary thickness, usually 5 to 15 microns thick. The aluminum layer 22 is then anodized such as by a conventional sulfuric acid anodizing solution.

Figure 3:
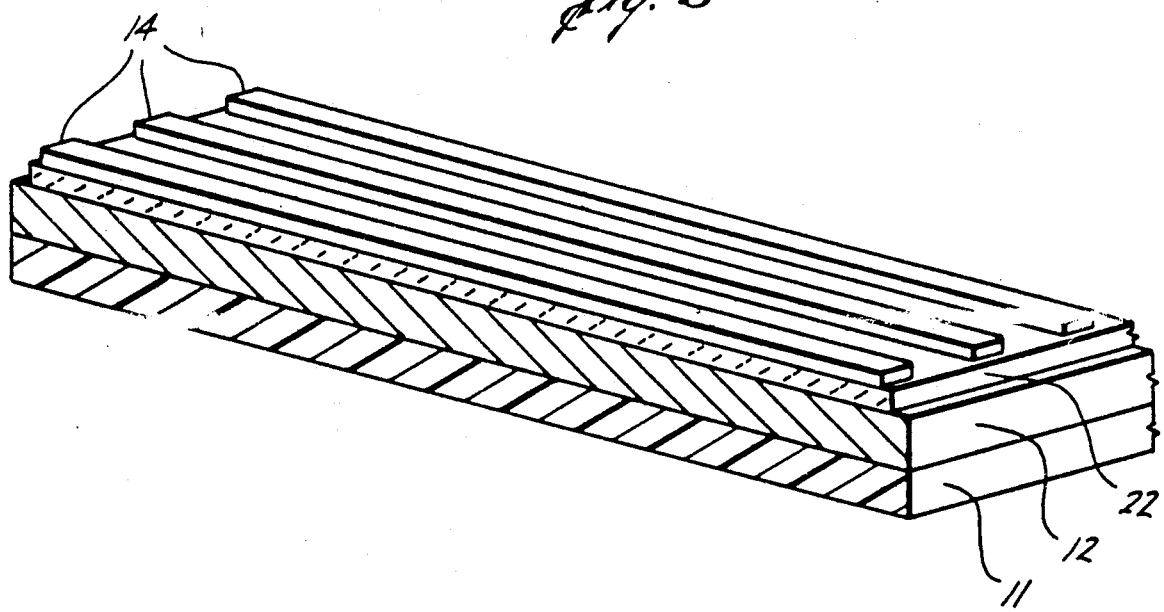
FIG. 3 is a view similar to FIG. 2 showing additional steps of the process.
Figure 4:
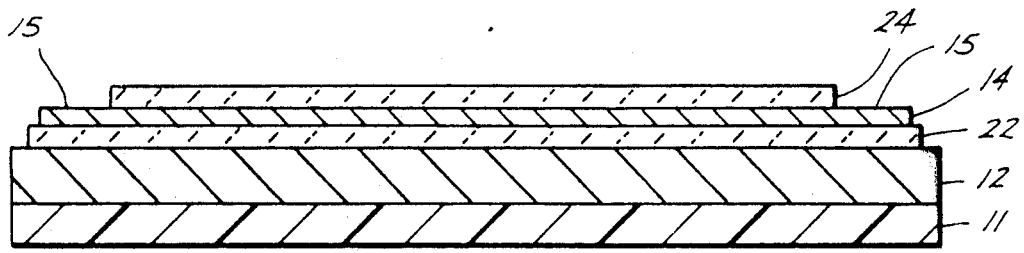
FIG. 4 is a view similar to FIG. 3 showing still further additional steps.

Thereafter, as best seen in FIG. 3, a second layer of molybdenum is applied over the anodized aluminum 22 by applying vacuum deposited molybdenum of the desired thickness, such as 1 to 5 microns thick. As best seen in FIG. 3, the vacuum deposited molybdenum is patterned using conventional photolitographic techniques which consist of applying a resist mask and etching away unwanted molybdenum to form the individual molybdenum feedthrus 14. Thereafter, as best seen in FIG. 4, a second layer of aluminum 24 is applied over the second layer of molybdenum 14, such as from 5 to 15 microns thick, but preferably leaving molybdenum contact areas 15 bare. The second layer of aluminum 24 is then anodized similar to the layer 22.

Figure 5:
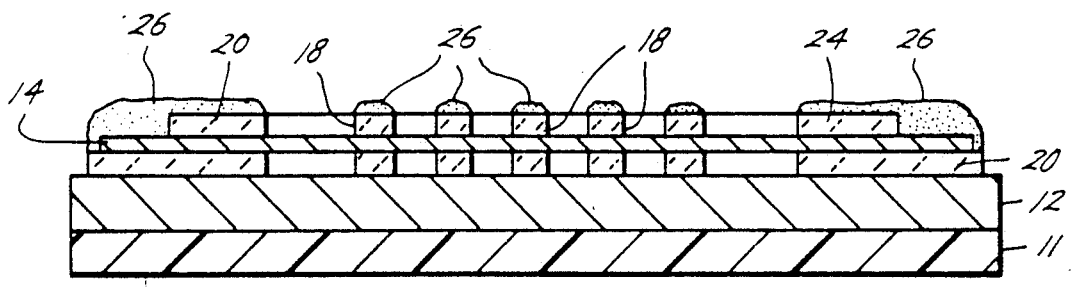
FIG. 5 is a view similar to FIG. 4 showing still further steps in the process of manufacture.

Referring now to FIG. 5, the next step in the process is to provide an etch mask to the top of the second layer 24 of anodized aluminum over areas where it is desired to provide supports and leaving the other areas bare. For example, a photoresist mask is applied to the top surface of the anodic aluminum layer 24 and a pattern is photolithographically printed on the mask, the mask is developed and cured, as is conventional, to provide an etch mask 26. The anodized aluminum layers 22 and 24 are then etched, such as using hydrofluoric acid or hydrofluoric acid diluted in water or chromic acid which will not attack the molybdenum. Since the anodized aluminum is columnar in microstructure, the etch is essentially anisotropic and yields a rather straight walled profile in the anodized aluminum layers 22 and 24. This step forms the support pillars 18 and the edge supports 20.

Referring now to FIG. 6, the molybdenum layers 12 and 14 are now exposed in the transverse direction and the molybdenum 12 and 14 is now oxidized. This step is performed by chemically cleaning the exposed molybdenum 12 and 14, such as by HF/HNO3 acid solution and oxidizing the molybdenum 12 and 14, such as by the step of heating in $O_2$ to 600° C., to a conventional depth, such as 0.1 to 0.3 microns in a furnace to provide a layer of molybdenum oxide. Thereafter, a reflow glass solution, such as Corning 7059 is applied in the air bridges created by the etching of the anodized aluminum at a high temperature, for example, 450° to 1000° C., preferably 700° C., to hermetically provide a glass-to-metal seal. The seal results from a partial dissolution of the molybdenum oxide in glass. A top layer of molybdenum 32, for example, of a thickness of 1 to 1,000 microns, may be applied over the layer 24 of anodized aluminum and is cleaned and sealed to the reflow glass 30 at this time or later.

Thereafter, the contact areas 15 of the molybdenum layer 14 and the top and bottom molybdenum plates 32 and 12 are etched clean, such as by HF/HNO3 etch solution, and then plated by conventional means, such as nickel flash with gold or copper overcoat, so that the various contacts will accept a solder or brazing seal.

The present invention, therefore, is well adapted to carry out the objects and attain the ends and advantages mentioned as well as others inherent therein. While a presently preferred embodiment of the invention has been given for the purpose of disclosure, numerous changes in the details of construction and steps of the method, will be readily apparent to those skilled in the art and which are encompassed within the spirit of the invention and the scope of the appended claims.

What is claimed is:

1. A hermetically sealed multilayered electrical connector for high-density substrates comprising, multiple vertical layers of electrical molybdenum conductors electrically separated from each other and including ends for input and output electrical connections, and at least some of the multiple layers having multiple conductors, said layers supported by a plurality of anisotropically etched anodized aluminum dielectric support pillars which are separated providing spaces between the pillars, said conductors and said spaces sealed by glass enclosing said conductors and pillars forming a hermetic glass-to-metal seal, and said conductors having contact portions at each end providing input and output connections to other conductors.

* * * * *